US006902313B2

(12) United States Patent
Ho et al.

(10) Patent No.: US 6,902,313 B2
(45) Date of Patent: Jun. 7, 2005

(54) MICRO CHAOTIC MIXER

(75) Inventors: Chih-Ming Ho, Brentwood, CA (US); Patrick Tabeling, L'Hay los Roses (FR); Yi-Kuen Lee, Los Angeles, CA (US); Joanne Helene Deval, Los Angeles, CA (US)

(73) Assignee: University of California, Oakland, CA (US)

(*) Notice: Subject to any disclaimer, the term of this patent is extended or adjusted under 35 U.S.C. 154(b) by 131 days.

(21) Appl. No.: 09/923,477

(22) Filed: Aug. 7, 2001

(65) Prior Publication Data

US 2003/0031090 A1 Feb. 13, 2003

Related U.S. Application Data

(60) Provisional application No. 60/224,292, filed on Aug. 10, 2000.

(51) Int. Cl.[7] .................................................. B81B 1/00

(52) U.S. Cl. ...................... 366/108; 366/340; 366/341; 366/DIG. 1; 366/DIG. 2; 204/450

(58) Field of Search ................................ 366/340, 341, 366/116, 108, 127, DIG. 1, DIG. 2, DIG. 3, DIG. 4; 204/454, 458, 450

(56) References Cited

U.S. PATENT DOCUMENTS 4,390,403 A * 6/1983 Batchelder .................. 204/547
4,879,011 A * 11/1989 Schram ................. 204/157.42
4,911,817 A * 3/1990 Kindlmann ................. 204/607
5,092,972 A * 3/1992 Ghowsi ...................... 204/454
5,126,022 A * 6/1992 Soane et al. ................ 204/458
5,858,187 A * 1/1999 Ramsey et al. ............. 204/452
5,904,824 A * 5/1999 Oh ............................. 204/601
5,965,001 A * 10/1999 Chow et al. ................ 204/600
6,010,316 A * 1/2000 Haller et al. ................ 417/322
6,120,665 A * 9/2000 Chiang et al. ............. 204/450
6,176,991 B1 * 1/2001 Nordman .................... 204/450
6,197,176 B1 * 3/2001 Pethig et al. ............... 204/643
6,344,120 B1 * 2/2002 Haswell et al. ............. 204/450
6,508,273 B1 * 1/2003 Van Den Berg ............ 204/454
6,524,790 B1 * 2/2003 Kopf-Sill et al. ........... 204/451
6,561,968 B1 * 5/2003 Dissing et al. ................ 600/13

OTHER PUBLICATIONS

Document entitled "An Actively Controlled Mixer", authored by Volpert, et al., presented at the *ASME International Mechanical Engineering Congress & Exprosition*; Nashville, TN, Nov. 14–19, 1999.

* cited by examiner

*Primary Examiner*—Tony G. Soohoo
(74) *Attorney, Agent, or Firm*—Greenberg Traurig, LLP; Charles Berman, Esq.

(57) ABSTRACT

A micro mixer for use in a microdevice which utilizes time-varying force fields to induce bulk fluid and/or sample component motion leading to homogenization of sample components. Time-varying force fields employed includes at least one of a physical displacement field, electrical field, pressure field or magnetic field to generate transverse forces which induce the mixing of samples within the micro mixer.

18 Claims, 7 Drawing Sheets

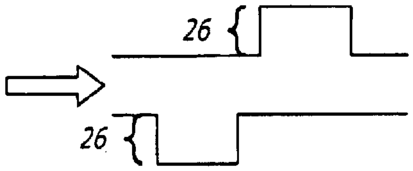
FIG. 2A
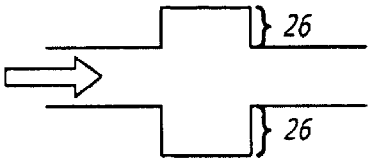
FIG. 2B
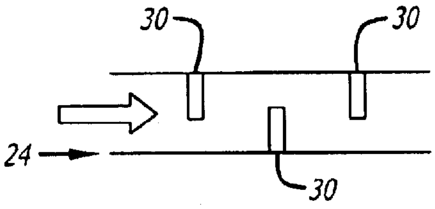
FIG. 2C
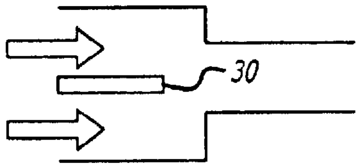
FIG. 2D
FIG. 2E
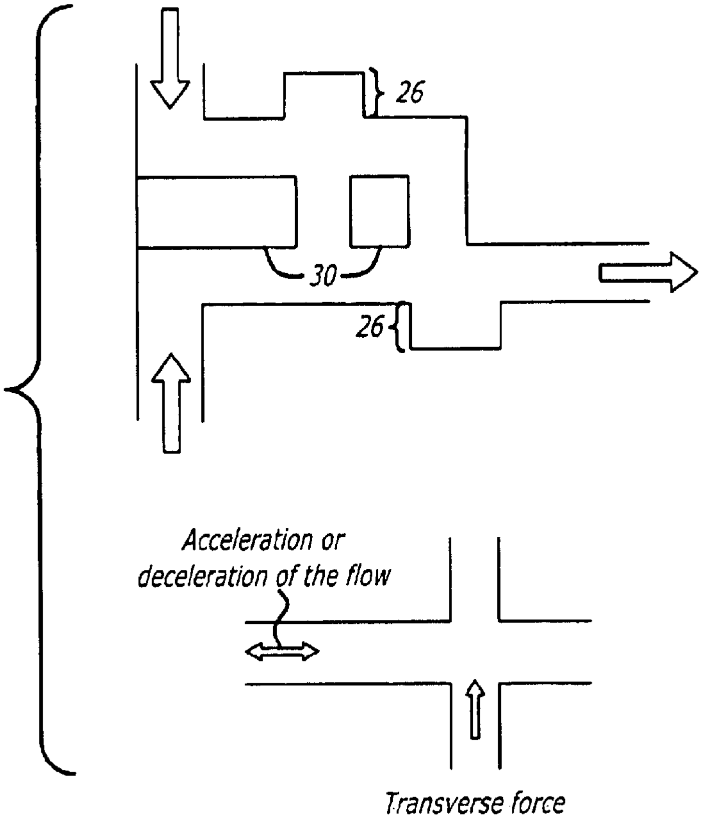

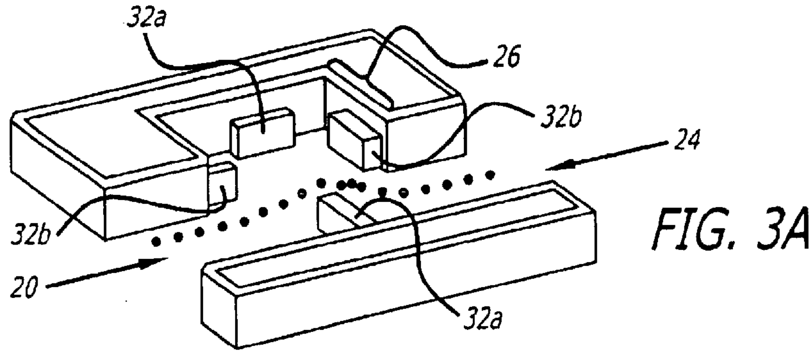
FIG. 3A
FIG. 3B
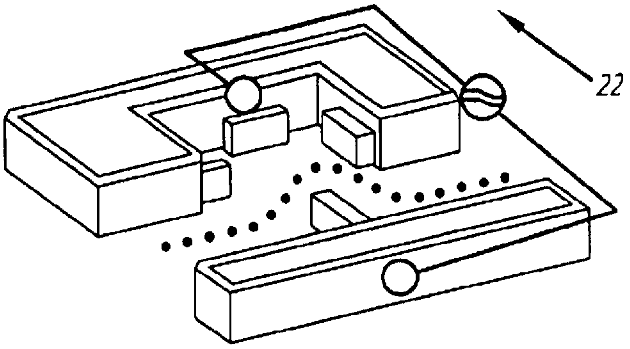
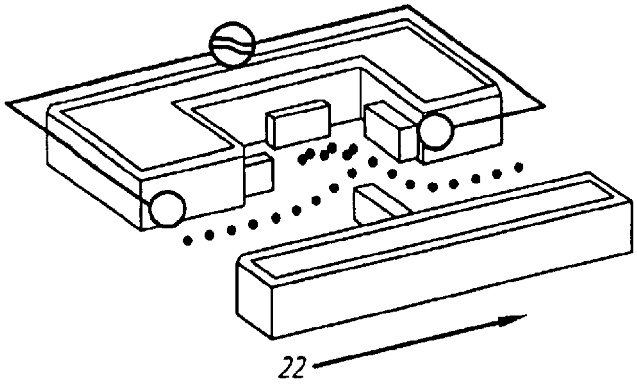
FIG. 3C
FIG. 3D
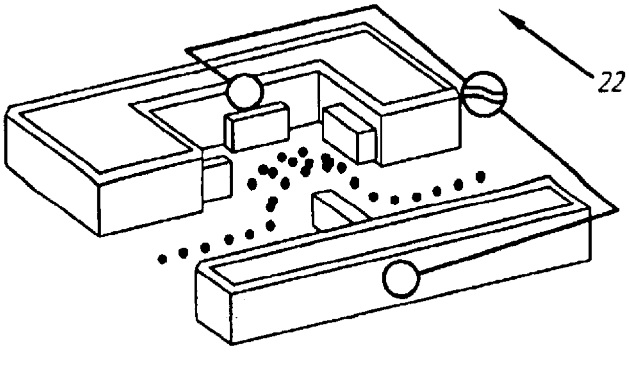

MICRO CHAOTIC MIXER

This appilcation claims priority to the provisional application with Ser. No. 60/224,292 and having a filing date of Aug. 10, 2000. +gi This invention was made with Government support under DARPA Contract No. N66001-96-C-83632, maniged by the Department of Navy. The Government has certain rights to this invention.

BACKGROUND OF THE INVENTION

1. Field of the Invention

This invention relates in general to micro mixers, and more specifically to micro mixers utilizing time-varying force fields to induce bulk fluid and/or sample component motion leading to homogenization of sample components.

2. Description of Related Art

Nano/Micro ("micro") devices have generally been developed to improve the speed, accuracy and cost efficiency of analytical methods for chemical, biological, engineering or medical applications. However, scaling down analytical systems results in changes to the relative magnitudes of various forces involved in the analytical system. Therefore, an improved efficiency in one task of a microdevice could be replaced by a loss of efficiency in another task in the microdevice.

Most analytical microdevices require the mixing of multiple fluids, the mixing of components embedded in a fluidic medium, or the homogenization of components distributed in a chamber. In micro scale devices, viscous effects greatly diminish fast mixing. Micro scale flows are characterized by low Reynolds numbers. Hence, instabilities cannot develop, and the effective mixing mechanisms which occur in turbulent flows (high Reynolds number) do not occur. Existing micro mixing methods rely on molecular diffusion to homogenize sample and/or reaction components. However, this mechanism results in a large time cost due to the slow rate at which diffusion naturally occurs. Thus, decreasing channel size leads to a shorter diffusion time, as diffusion varies with the second power of the characteristic dimension of the channel.

However, other methods may be employed to speed mixing of samples in a microdevice. For example, a first sample can be forced through a 2-D nozzle array into a second sample, so that the mixing interface is increased, and thereby the diffusion time required for mixing the two samples is reduced. Another technique for mixing samples in a microdevice is to use at least one mechanical pump to control the filling and/or removal of the sample components into and out of a closed cavity, producing fluid motions. However, these micro mixing methods require a high energy input, and additional mechanical components which increase the size and complexity, and therefore decrease the efficiency, of the microdevice. Therefore, there is a need for a micro mixer to facilitate the efficient homogenization of sample components in microdevices.

SUMMARY OF THE INVENTION

The present invention provides an improved micro mixer which obviates for practical purposes the above mentioned limitations. The micro mixer is efficient, simply constructed and can be easily integrated into any microdevice.

Further, the micro mixer produces an improved rate of sample homogenization in a decreased amount of time relative to diffusion alone. Additionally or alternatively, the micro mixer produces an improved rate of sample homogenization with a decreased energy expenditure relative to other known methods of sample mixing in microdevices. The micro mixer can be used to mix bulk fluids and/or sample components within the channels of the micro mixer. Finally, the micro mixer can operate in a microdevice having open chambers or closed chambers.

The micro mixer includes at least one means for exerting a time-varying force field upon sample components to induce mixing. Using this system, effective mixing can be achieved by applying perturbations to the sample components and drive the system towards a chaotic regime. Alternatively, effective mixing can be achieved by applying perturbations to the sample component motions and inducing chaotic trajectories.

The foregoing and other objects, features, and advantages of the present invention will be apparent from the following detailed description of the preferred embodiments which makes reference to several drawing figures.

BRIEF DESCRIPTION OF THE DRAWINGS

A detailed description of the embodiments of the invention will be made with reference to the accompanying drawings, wherein like numerals designate corresponding parts in the several figures.

FIG. 1A depicts the flow path of the sample components through the micro mixer; FIGS. 1B–D depict sample interface folding, and consequently sample component homogenization during flow through the open-chamber micro mixer.

FIGS. 2A–E are schematic diagrams of a sample components flowing through various embodiments of an open-chambered micro mixer. FIG. 2F depicts the directionality of transverse force application relative to the axial flow path.

FIG. 3 is a schematic diagram depicting the folding of a sample interface after successive application of a time-varying force field by opposite electrode alimentation.

FIG. 8 depicts the stretching and folding of a sample interface as a time-varying pressurized force field is applied in one embodiment of the micro mixer. The white line indicates the evolution of the sample interface between the sample components (fluorescent dye labeled DI water upper sample, and DI water lower sample)

DETAILED DESCRIPTION OF THE PREFERRED EMBODIMENTS

Figure 1A:
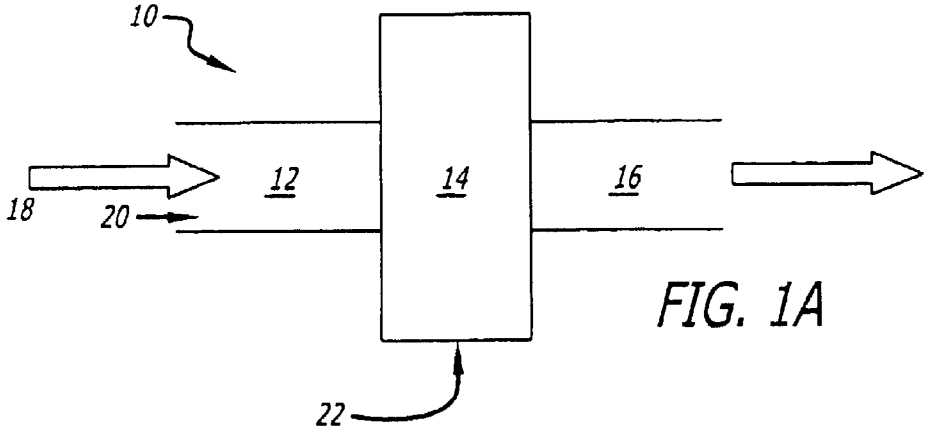
FIGS. 1A–D are schematic diagrams of sample components flowing in-line through an open-chamber micro mixer.

In the following description of the preferred embodiments reference is made to the accompanying drawings which form the part thereof, and in which are shown by way of illustration specific embodiments in which the invention can be practiced. It is to be understood that other embodiments can be utilized and structural and functional changes can be made without departing from the scope of the present invention.

The micro mixer includes at least one means for exerting a time-varying force field upon sample components within it. The amplitude, the direction or more generally any of the parameters defining the force field upon the sample components can be modified with time. The means for exerting a time-varying force field upon the sample components can be produced by any one of: electrical fields (which can induce different electrokinetic forces on samples, such as dielectrophoresis, electrophoresis, electro-osmosis), magnetic fields, mechanical fields (such as hydrodynamic pressure fields) or positive displacement fields (induced by an obstacle on the side wall or in the channel, or by wells within the side walls, or more generally by modifications of the shape of the channel inner wall of the micro mixer). Further, any of the means for exerting a time-varying force field described above can be combined in the micro mixer to induce mixing of sample components at a greater rate than that achieved with diffusion alone. Preferably, mixing of sample components occurs at a rate of about 2 to about 100 times faster than diffusion alone.

As illustrated in FIG. 1, in an open chambered (or in-line) micro mixer 10, sample components ½ move through the micro mixer 10 by passing sequentially through areas including an upstream region 12, a mixing region 14 and a downstream region 16. Sample components ½ entering the upstream region 12 are initially flowing along an axial flow path 18 through the micro mixer channel 20, and separated by a sample interface 3, and are therefore substantially unmixed. As the sample components 1/2 enter the mixing region 14, they are exposed to time-varying force fields 22, which are substantially transverse in direction relative to the axial flow path 18 of the sample components 1/2. Preferably, the force field 22 created is at a direction perpendicular (90°) to the axial flow path 18. However, a force field 22 at a direction of less than 90° to the axial flow path would also be useful in practicing the invention. Application of the force field 22 causes a transverse velocity, which then modifies the default velocity distribution established by the normal axial flow path 18, resulting in a velocity gradient which contributes to sample component mixing.

A time-varying force field 22 can be created by at least one or combinations of electrical fields, magnetic fields, pressure fields, mechanical fields and/or physical displacement fields.

A time-varying force field 22 can be created by altering the flow rate of the sample components 1/2 into the micro mixer 10. A difference in the relative flow rate of one sample relative to a second sample, for example, creates a transverse force field 22 upon the sample interface 3. Preferably, the flow rates of sample components 1/2 entering the micro mixer 10 are between about zero cc/sec and about 12 cc/sec.

Further, time-varying force fields 22 can be created by positive displacement fields with or without mass removal. The positive displacement field can be designed in a way such as the total time-average sample mass exchange over a given region is zero (without mass removal) or non-zero (with mass removal). Positive displacement fields can be created generally by modifying the regularity of the shape and or volume of the micro mixer channel 20 or channel wall 24.

FIGS. 1 & 2 depict specific examples of how positive displacement fields can be induced. For example, positive displacement fields can be created by the formation of at least one cavity 26, which extends from the micro mixer channel wall 24 into the micro mixer wall 28 (FIGS. 1A–C). The size (height, width and depth) and shape (rectangular, trapezoidal or spherical, for example) of the cavity 26 can be selected to produce the desired transverse force 22. Further, the number of cavities 26 (one or more) or position of cavities 26 relative to one another along the micro mixer channel wall 24 can be selected to produce the desired transverse force 22 (FIGS. 2A & B).

Figure 1B:
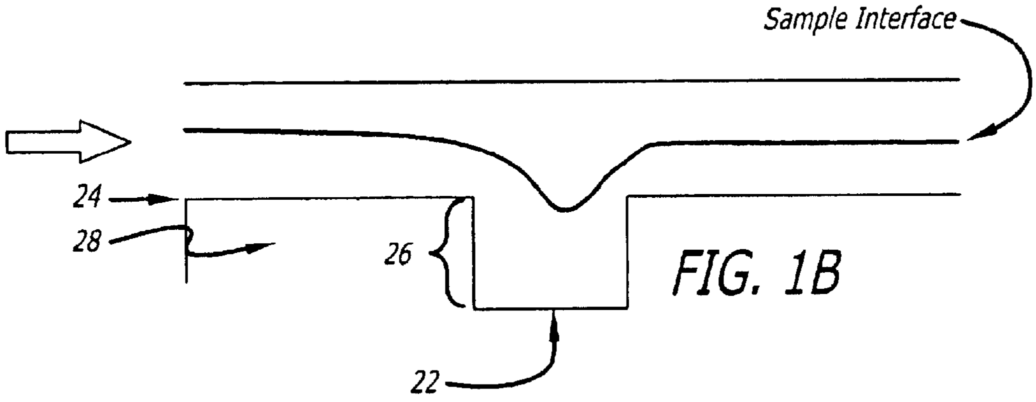
Figure 1C:
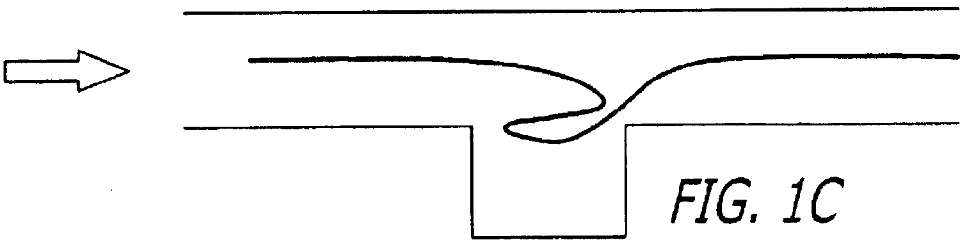
Figure 1D:
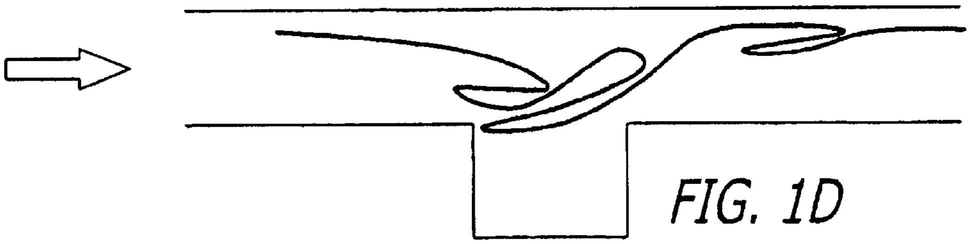

As depicted in FIG. 1, as the sample components 1/2 flow into the mixing region 14, the sample interface 3 is bent by the transverse force 22 causing the flow path 18 to be directed into the cavity 26 (FIG. 1B). The bent sample interface 3 is advected (moved horizontally) by the horizontal flow path 18 at different speed due to the transverse velocity gradient (FIG. 1C), and the sample interface 3 consequently undergoes a sequence of folding and stretching which causes mixing between the sample components 1/2 (FIG. 1D).

Additionally, or alternately, positive displacement fields can be created by the formation of at least one obstacle 30 extending from the micro mixer channel wall 24 into the lumen of the micro mixer channel 20 (FIG. 2C). The obstacles 30 can be formed as integral to the micro mixer wall 24, or can be formed separately and added to the micro mixer wall 24 during construction of the micro mixer 10. Finally, obstacles 30 can be positioned within in the micro mixer channel 20 having no attachment to the micro mixer channel wall 24 (FIG. 2D). The size (height, width and depth) and shape (rectangular, trapezoidal or spherical, for example) of the obstacle 30 can be selected to produce the desired transverse force 22. Further, the number of obstacles 30 (one or more) or position of obstacles 30 relative to one another along the micro mixer channel 20 can be selected to produce the desired transverse force 22 (FIGS. 2C & D). As illustrated in FIG. 2D, any one or combination of cavities 26 or obstacles 30 can be used to achieve the desired transverse force 22.

Further, the overall shape and relative position of the micro mixer channel 20 and/or wall 24, including the upstream region 12, the mixing region 14 and/or the downstream region 16 can be altered to produce the desired transverse force 22 on the sample component interface 3. As illustrated in FIG. 2E, two cavities 26, two obstacles 30 and time-dependent flow-rates are used to obtain the transverse force resulting in mixing of the sample components 1/2.

In embodiments using physical displacement fields to create transverse forces, a velocity gradient is produced by a the obstacles 30 (or wells) creating forces transverse to the initially unperturbed sample interface 3, and mixing occurs by folding and stretching of the sample interface 3, as described above. In the embodiment illustrated in FIG. 2D, for example, the velocity gradient is created as the sample interface 3 flows by the obstacle 30, and mixing occurs as the transverse force 22 affects the flow rejoining around the downstream end of the obstacle 30.

A time-varying force field 22 can also be created by an electrical field. An electrical field may induce different electrokinetic forces on sample components, including but not limited to dielectrophoresis, electrophoresis, and electro-osmosis. Electrical fields may be generated by AC and/or DC currents and preferably comprise voltages from about 1 volt to about 1000 volts, and frequencies ranging from about 1 Hz to about 1 GHz.

Figure 6A:
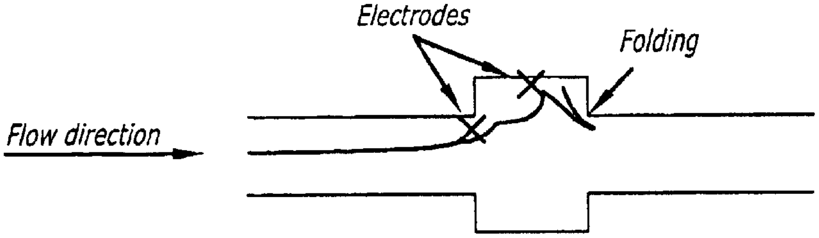
FIG. 6A depicts the kinematic simulation of one embodiment of the micro mixer showing the pattern of 1000 particles moving through the micro mixer channel.

In one embodiment, an electrical field can be induced by applying a voltage to electrodes 32 positioned in proximity to the sample components 1/2 to induce electrokinetic perturbation of the sample. The type of electrodes 32 used, timing and voltage (and frequency for AC signal) used during the application can be selected to produce the desired transverse force 22. Further, the number of electrodes 32 (one or more) and/or position of electrodes 32 relative to one another along the micro mixer channel 20 can be selected to produce the desired transverse force 22. For example, as depicted in FIG. 3A, the electrodes may be placed on opposite walls of the micro mixer channel 30, or as depicted in FIG. 6A the electrodes may be placed in line along the micro mixer wall 24. The position of the electrodes 32 relative the channel wall 24 can also be varied. For example, electrodes may be placed on the surface of the channel wall 24, extending into the channel 20, or outside of the channel 24, but within the body of the micro mixer 28.

For example, at least one electrode 32 placed in proximity to the sample components 1/2 in the micro mixer 10 may be used to create a transverse force 22 on the sample interface 3. The transverse force 22 may be created by activating the electrode 32 to a selected voltage and modulating the electrode 32 to a second voltage (which may be zero volts) at a selected interval to induce electrokinetic perturbations in the sample components 1/2. Additionally or alternatively, the frequency of the electrode signal may be altered at selected time intervals to induce electrokinetic perturbations (where AC is applied). Alternatively, multiple electrodes may be used. For example, a first electrode may be activated and its voltage and/or frequency modulated at a selected interval while a second electrode is activated but not modulated. As depicted in FIG. 3, an electrode pair **36*a* may be activated or modulated in unison to induce electrokinetic perturbations in sample components 1/2, or multiple electrode pairs 36*a/b*** may be used.

As illustrated in FIG. 3, opposite electrode alimentation may be used to create transverse forces which induce sample mixing. As the substantially unmixed sample components 1/2 flow through the micro mixer channel 20, a first electrical field can be created between a first pair of opposite electrodes **32*a* causing the sample interface 3 to be bent by the transverse force 22 created by the electrical field (FIG. 3B). This first electrical field can be switched off or any of its parameters (voltage, frequency if AC signal, etc.) can be modulated. Subsequently, a second electrical field may be induced between a second pair of opposite electrodes 32*b* causing the sample interface 3 to be bent further by the transverse force 22 created by the electrical field. (Further, as illustrated above, the flow path may be directed into a cavity 26 in the micro mixer channel 20 to further induce mixing (FIG. 3C).) The second electric field can be switched off or parameters can be modulated. The first and second electrical field can be alternately applied to induce a sequence of folding and stretching which causes mixing between the sample components 1/2 (FIG. 3D**) which flow out of the mixing area, substantially mixed.

Figure 4:
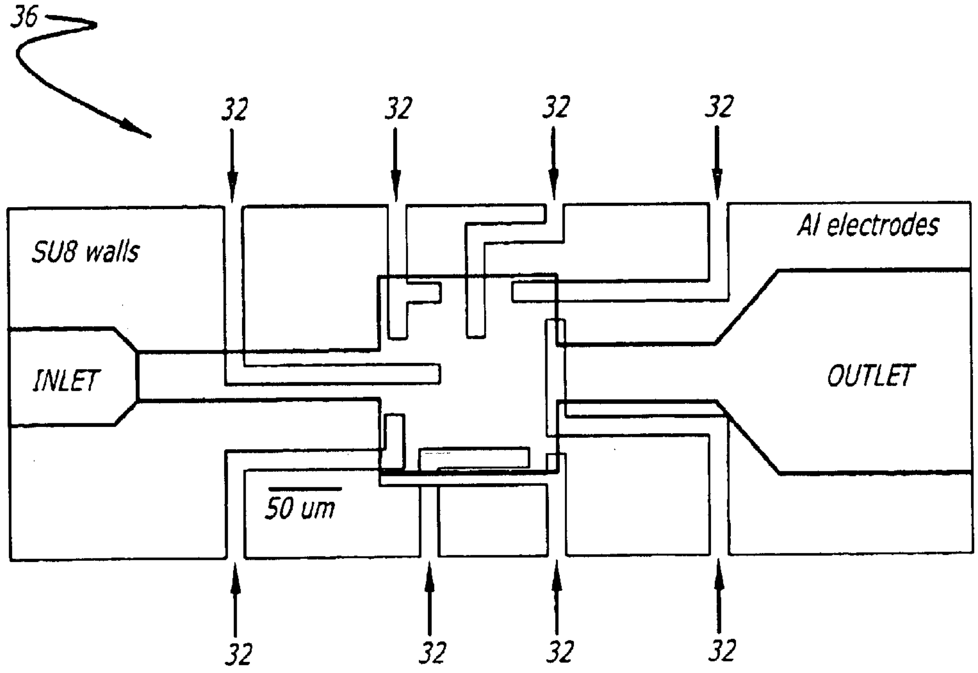
FIG. 4 is a top view of one embodiment of a micro mixer utilizing an electrical field to induce mixing.

As illustrated in FIG. 4, sample components 1/2 are mixed by applying time-varying electrical fields 22. The electrokinetic perturbations in the micro mixer 10 are applied in a chamber 36 (200×200×25 $\mu m^3$, for example). Therein, a 1 MHz AC voltage modulated pulse train can be applied between selected pairs of electrodes 32. The time-varying field exerts a positive dielectrophoretic force on the sample components 1/2 (for example, suspended 0.5 $\mu$m size particles) and controls the flow path 18, causing folding and stretching of the sample interface 3 resulting in mixing of the sample components 1/2.

Figure 5:
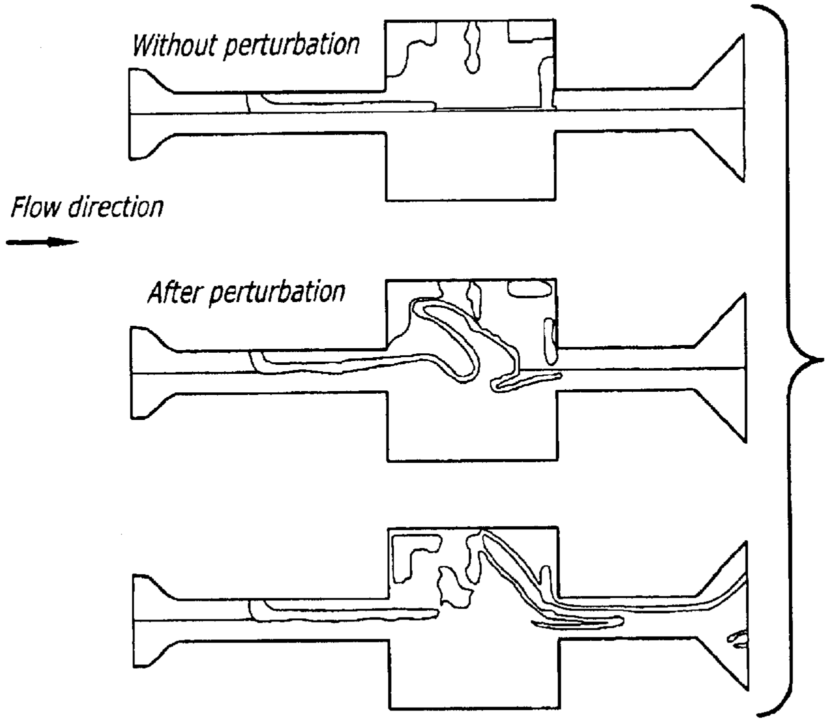
FIG. 5 depicts the stretching and folding of a sample interface as electrokinetic perturbation is applied in one embodiment of the micro mixer. The white line indicates the evolution of the sample interface between the sample components (solution, lower component and DI water, upper component).
Figure 6B:
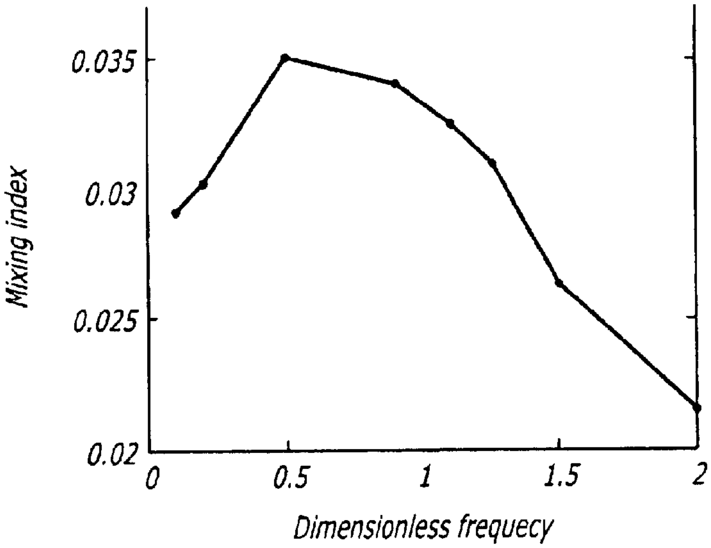
FIG. 6B depicts the mixing index calculated after the kinematic simulation of another embodiment of the micro mixer for different force fields frequencies.

As is seen in FIG. 5, without applying an electrical field, the sample interface 3 separating two samples 1/2 remains sharp (one fluid contains 0.5 $\mu$m polystyrene particles). As the electrical fields are applied by activation of electrode pairs, a sequence of folding and stretching occurs. This process homogenizes the sample components 1/2 across the sample interface 3. Kinematic numerical simulations can be conducted to confirm the existence of chaos in the micro mixer 10 with electrokinetic perturbation (FIG. 6A) and in the micro mixer with hydrodynamic perturbations (FIG. 6B).

A time-varying force field 22 can also be created by a magnetic field created by at least one magnet placed in the proximity of the sample components 1/2 within the micro mixer 10. The number of magnets or magnet pairs used, timing and polarity used during the application can be selected to produce the desired transverse force 22 via a magnetic field, similar to as described for the application of electrical fields above. Further, the position of the magnets relative to one another along the micro mixer channel 20 can be selected to produce the desired transverse force 22. The position of the magnets relative the channel wall 24 can also be varied. For example, magnets may be placed on the surface of the channel wall 24, extending into the channel 20, or outside of the channel 24, but within the body of the micro mixer 28.

A transverse force 22 can also be created by a mechanical field, which includes but is not limited to pressure fields or hydraulic fields.

Figure 7:
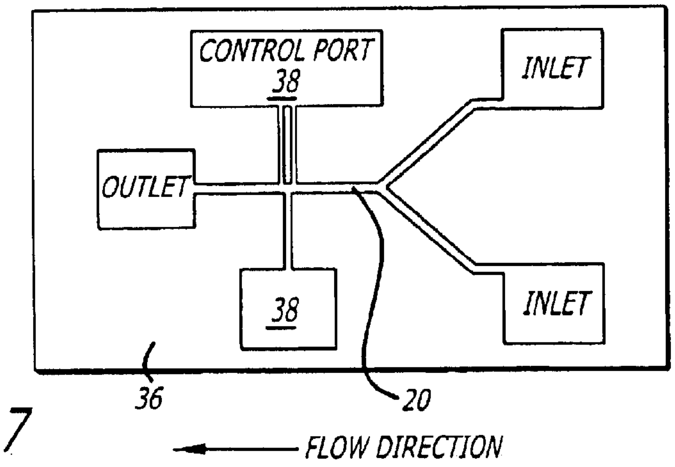
FIG. 7 depicts the top view of another embodiment of the micro mixer utilizing pressure fields to induce mixing.

In one specific embodiment illustrated in FIG. 7, sample components are mixed by applying time-varying fields 22 (perturbations). A pump (such as a syringe pump, or other suitable pressure control equipment for regulating the flow rate of the sample components) can be used to drive sample components into the micro mixer channel 20. Preferably, the samples are introduced into the micro mixer channel 20 at different rates to induce a transverse field 22 upon the sample interface 3. However, sample components 1/2 can be introduced into the micro mixer channel at the same flow rate as well.

Figure 8A:
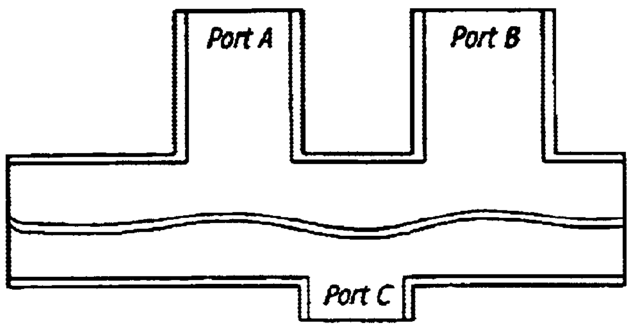
FIG. 8A depicts the sample interface without the application of force.
Figure 8B:
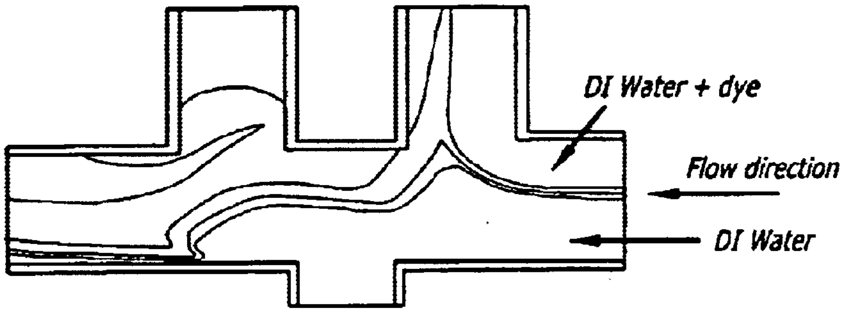
FIG. 8B depicts the sample interface with a 0.55 Hz oscillating pressure drop taking place between ports B and C, where flow velocity is 840 $\mu$m/s, for example.
Figure 9:
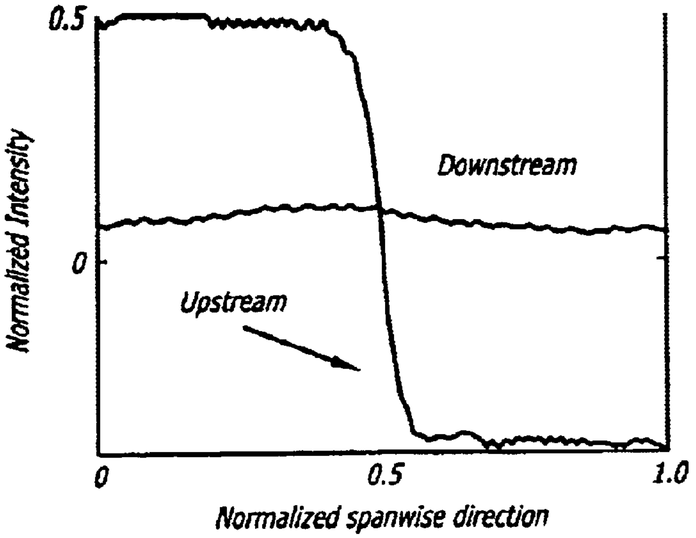
FIG. 9 depicts concentration profiles, transverse to the micro mixer channel, showing mixing in one embodiment of the micro mixer.

Further, pressure fields may be applied transversely to the sample interface 3 by at least one adjacent channel unit 36 connected to a controlled pressure reservoir 38 and in communication with the micro mixer channel 20, for example. In one embodiment, there is a micro mixer 10 having a first and second pump at inlet 1 and 2, respectively for regulating the flow rate of a first 1 and second 2 sample components into the micro mixer channel 20. Further, there is also at least one pressure reservoir 38 situated so as to generate a transverse pressure field 22 onto the sample components traveling in the axial flow path 18 along the micro mixer channel 20. The pressure reservoir may contain a pumping device to direct the fluid flow through the adjacent channel unit 36 to the micro mixer channel 20. As is seen in FIG. 8A, without applying the pressure field, the sample interface 3 remains sharp (one fluid is labeled with a fluorescent dye). As the pressure fields are applied by the pressure reservoir via the adjacent channel unit, a sequence of folding and stretching of the sample interface 3 within the micro mixer channel 20 occurs. FIG. 8 shows 2 expanded views of one embodiment of the device depicted in FIG. 7, corresponding to the area where the micro mixer channel 20 crosses the adjacent channel unit (having 3 vertical channels) originating from control port 38. Under these conditions, a highly convoluted sample interface 3 is created and further smoothened by diffusion, resulting in mixing of the samples 1/2. Cross-stream light profiles can be conducted to confirm the effectiveness of the chaotic mixing (FIG. 9).

In some embodiments the adjacent channel unit 36 may comprise a single channel or multiple channels in communication with the micro mixer channel 20. The channel(s) may communicate with the micro mixer channel 20 at an angle of about 90° or less. An adjacent channel unit 36 may be repeated at selected intervals along the length of the micro mixer channel 20, and may communicate to the micro mixer channel 20 via the top or bottom micro channel wall 24*a* and 24*b*, respectively.

Figure 10:
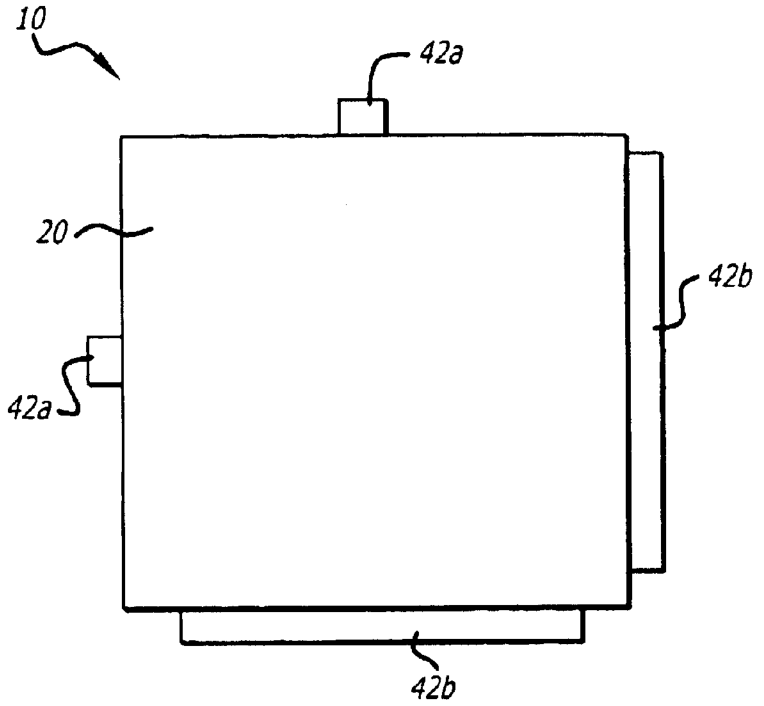
FIG. 10 is a schematic diagram of a closed-chamber micro mixer.

As illustrated in FIG. 10, in a closed chamber micro mixer 10 having zero mean flow, sample components 1/2 do not flow through the micro mixer 10, but are admixed within a closed system. As sample components 1/2 enter the micro mixer 10, they are substantially unmixed. However, once inside of the micro mixer 10, they are exposed to time-varying forces 22. The application of the time-varying forces 22 to the sample components 1/2 at least results in a stretching and folding of the sample interface to obtain mixing at a rate greater than diffusion.

As described for open chamber micro mixers above, a time-varying force 22 can be created by at least electrical fields, magnetic fields, mechanical fields, mechanical devices or positive displacement devices, or the combination of any of the above.

In one embodiment of the micro mixer illustrated in FIG. 10, an electrode 42, or a plurality of electrodes 42*a*/*b* can be used to produce electrical fields which affect charged (or non-charged) particles in the sample components 1/2 which are initially separated by a sample interface 3. By applying the time-varying voltages to various pairs of electrodes 42*a*/*b* sequentially, the interface is stretched and folded thereby mixing the sample components 1/2. Further, after application of the field, the field may be terminated or parameters modulated to further induce mixing.

Sample components are preferably fluidic, but can be in any form including, but not limited to solid or gaseous. The sample components can contain elements that are charged or not charged. Sample components can include, but are not limited to containing molecules, cells and/or particles. Any number of sample components may be mixed using the system described above including a single solid in a single fluid medium.

Figure 11:
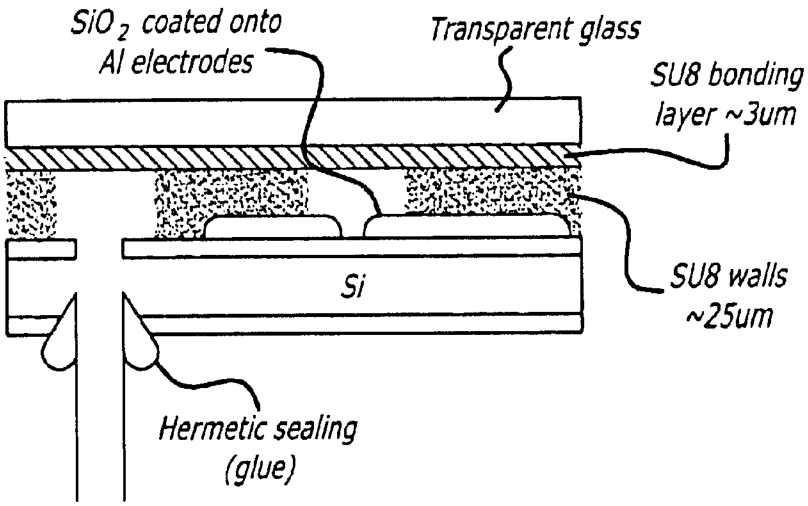
FIG. 11 is a cross-sectional view of the construction of one embodiment of a micro mixer.

The micro mixer can be fabricated by many technologies including micromachining technology. In some embodiments, for example (FIG. 4), inlet and outlet holes can be anisotropically etched with KOH from the backside (FIG. 11). After electrode patterning on a silicon wafer, for example, and insulation, SU-8 photoresist can be coated on the wafer and selectively exposed to form the channel walls. A thin glass slide can then be bonded to the wafer to close the channel. In some other embodiments for example, the micro mixer can be fabricated using the deep reactive ion etching technique to etch the channels in a silicon wafer, which can be anodically bonded to Pyrex glass plates. Examples of fabrication technologies are widely described in at least in M. Madou. *Fundamentals of Microfabrication*, CRC Press, 1997 and Lee, Deval, Tabeling, Ho. *Chaotic Mixing in Electrokinetically and Pressure Driven Micro Flows*, in Proceedings of the 14$^{th}$ IEEE International Conference on Micro Electro Mechanical Systems (MEMS 2001), Interlaken, Switzerland, Jan. 21–25, 2001, pp. 483–486, herein incorporated by reference.

In all embodiments, proper operating parameters, time-variations of force field application, flow speed and other parameters relevant to the operation of the micro mixer should be optimized to enhance sample homogenization.

The foregoing description of the preferred embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A micro mixer having at least one means of creating a time-varying force field for inducing homogenization of a first and second sample component within a micro mixer channel at a rate greater than that of diffusion alone, and wherein the time-varying force field creates a transverse force upon a sample interface between the first and second sample component, whereby the homogenization of the first sample component and the second sample component is effected by chaotic motion between the components.

2. A micro mixer of claim 1, wherein the time-varying force field used to generate a transverse force on a first sample component and a second sample component separated by a sample interface is at least one of a physical displacement field, electrical field, pressure field, or a magnetic field.

3. The micro mixer of claim 2 wherein the electrical field is created by an AC or a DC source.

4. A micro mixer of claim 3, wherein the electrical field creates a transverse force using at least one electrode adjacent to the micro mixer channel, and wherein the electrode is activated to a selected first voltage and subsequently modulated to a second selected voltage at a selected interval to induce electrokinetic perturbations in the sample interface.

5. A micro mixer of claim 4, wherein the second selected voltage is zero volts.

6. A micro mixer of claim 3, wherein the electrical field creates a transverse force using at least one electrode adjacent to the micro mixer channel, wherein the electrode is activated to a first selected frequency and subsequently modulated to a second selected frequency to induce electrokinetic perturbations in the sample interface.

7. A micro mixer of claim 3, wherein the electrical field creates a transverse force by application of at least a first voltage at a first frequency by a first electrode and application of at least a second voltage at a second frequency by a second electrode, and wherein the first voltage and/or first frequency of the first electrode is modulated at a selected interval, and wherein the second voltage and/or second frequency of the second electrode is not modulated.

8. A micro mixer of claim 3, wherein the electrical field creates a transverse force by alternate application of a at least first voltage at a that frequency between a pair of electrodes and a second voltage at a second frequency between the pair of electrodes.

9. A micro mixer of claim 3, wherein the electrical field creates a transverse force by alternate application of a at least first voltage between a first pair of electrodes and a second voltage between a second pair of electrodes.

10. A micro mixer of claim 3, wherein the electrical field creates a transverse force by alternate application of a at least first voltage at a lint frequency between a first pair of electrodes and a second voltage at a second frequency between a second pair of electrodes.

11. A micro mixer of claim 2, wherein the transverse force is at an angle of 90° to the sample interface.

12. A micro mixer of claim 2, wherein the transverse force is at an angle of loss than 90° to the sample interface.

13. A micro mixer of claim 1, wherein the micro mixer is open chambered.

14. A micro mixer of claim 1, wherein the micro mixer is close chambered.

15. A microdevice comprising a micro mixer having at least one means of creating a time-varying force field for inducing homogenization of sample components within a micro mixer channel at a rate greater than that of diffusion alone, whereby the homogenization of the sample components is effected by chaotic motion between the components.

16. A method of inducing sample mixing utilizing a micro mixer having at least one means of creating a time-varying force field for inducing homogenization of sample components within a micro mixer channel at a rate greater than that of diffusion alone, whereby the homogenization of the sample components is effected by chaotic motion between the components.

17. A micro mixer having at least one means of creating a time-varying electrical field for inducing homogenization of a first and second sample component within a micro mixer channel at a rate greater than that of diffusion alone, and wherein the time-varying force field creates a transverse force upon a sample interface between the first and second sample component;

wherein the electrical field creates a transverse force using at least one electrode inside the micro mixer channel, and wherein the electrode is activated to a selected first voltage and subsequently modulated to a second selected voltage at a selected interval to induce electrokinetic perturbations in the sample interface, whereby the homogenization of the first sample component and the second sample component is effected by chaotic motion between the components.

18. A micro mixer having at least one means of creating a time-varying electrical field for inducing homogenization of a first and second sample component within a micro mixer channel at a rate greater than that of diffusion alone, and wherein the time-varying electrical field creates a transverse force upon a sample interface between the first and second sample component;

wherein the time varying electrical field creates a transverse force by application of at least a first voltage at a first frequency by a first electrode and application of at least a second voltage at a second frequency by a second electrode, and wherein the first voltage and/or first frequency of the first electrode is modulated at a selected interval, and wherein the second voltage and/or second frequency of the second electrode is not modulated;

wherein the first and the second electrodes are positioned inside the channel to induce a folding and stretching effect on an interface between the first and the second sample component, whereby the homogenization the first sample component and the second sample component is effected by chaotic motion between the components.

* * * * *